(12) United States Patent
Botelho (10) Patent No.: US 11,169,191 B2
(45) Date of Patent: Nov. 9, 2021

(54) METHOD AND APPARATUS FOR ESTIMATING A PHASE RELATION BETWEEN BINARY SIGNALS

(71) Applicant: Rohde & Schwarz GmbH & Co. KG, Munich (DE)

(72) Inventor: Sergio Botelho, Portland, OR (US)

( * ) Notice: Subject to any disclaimer, the term of this patent is extended or adjusted under 35 U.S.C. 154(b) by 251 days.

(21) Appl. No.: 16/369,699

(22) Filed: Mar. 29, 2019

(65) Prior Publication Data

US 2020/0309832 A1    Oct. 1, 2020

(51) Int. Cl.
*G01R 25/00*  (2006.01)
*G11C 11/4076*  (2006.01)

(52) U.S. Cl.
CPC ........ G01R 25/005 (2013.01); *G11C 11/4076* (2013.01)

(58) Field of Classification Search
CPC .... G11C 11/4076; G11C 29/028; G01R 25/02
See application file for complete search history.

(56) References Cited

U.S. PATENT DOCUMENTS

| | | | | |
|---|---|---|---|---|
| 2009/0262876 A1* | 10/2009 | Arima | ................... | H03L 7/0812 375/374 |
| 2011/0235459 A1* | 9/2011 | Ware | .................... | G11C 7/1051 365/233.11 |
| 2013/0038349 A1* | 2/2013 | Hsu | ........................... | G06F 1/08 326/93 |
| 2014/0240014 A1* | 8/2014 | Yamakawa | ............ | G11C 29/42 327/160 |
| 2014/0313847 A1* | 10/2014 | Jeong | ....................... | G11C 8/18 365/233.12 |
| 2015/0255129 A1* | 9/2015 | Chen | .................... | G11C 7/1072 711/105 |
| 2019/0129465 A1* | 5/2019 | Tomar | ................. | G06F 13/1689 |

FOREIGN PATENT DOCUMENTS

JP    4943274 B2    5/2012

* cited by examiner

*Primary Examiner* — Alvaro E Fortich (57) ABSTRACT

Techniques for estimating a phase relation between a first binary signal and a second binary signal, in particular to a clock-to-data phase detection in double-data-rate signals. The binary signals may include both rising and falling signal edges. Techniques may include determining a first and second signal edge for the first binary signal and comparing the signal edges of the first binary signal to one or more signal edges of the second binary signal, then performing one or more calculations based on the comparisons. The phase relation between the first binary signal and the second binary signal may be determined based on the one or more calculations.

17 Claims, 7 Drawing Sheets

METHOD AND APPARATUS FOR ESTIMATING A PHASE RELATION BETWEEN BINARY SIGNALS

TECHNICAL FIELD

The invention relates to a method and apparatus for estimating a phase relation between a first binary signal and a second binary signal, in particular to a clock-to-data phase detection in double-data-rate signals.

BACKGROUND

In many use cases, it is necessary to perform a phase detection between two signals, in particular binary or digital signals. With increasing bit rate and data transfer rates as well as higher clock frequencies, the estimation of a phase relation between binary signals becomes more and more challenging. Digital or binary signals can be transmitted via a signal line along with a separate clock signal allowing the reconstruction of the transmitted signal. A system operating with double-data-rate DDR transfers data both on the rising and falling edges of a clock signal CLK. Memory chips can comprise a double-data-rate interface to provide high bandwidth. There exists different kinds of double-data-rate SDRAMs, in particular DDR2, DDR3 and/or DDR4 Synchronous Dynamic Random Access Memory (SDRAM). The memory clock rate comprises a typical frequency of more than 100 MHz. For decoding a double-data-rate signal protocol decoder can be used receiving a clock signal (strobe) and one or more data signals. For proper decoding, it is necessary to detect phase differences between the received clock signal and the data signals. Accordingly, there is a need to provide a method and apparatus for estimating a phase relation between a first binary signal such as a clock signal and a second binary signal such as a data signal precisely.

SUMMARY OF THE INVENTION

The invention provides according to a first aspect a method for estimating a phase relation between a first binary signal and a second binary signal wherein both binary signals comprise over the course of time rising and falling signal edges at edge times, wherein the method comprises the steps of: determining a first edge time and a subsequent second edge time of the first binary signal and determining a third edge time of the second binary signal, and estimating the phase relation between the first binary signal and the second binary signal based upon the first, second and third edge times.

In a possible embodiment of the method according to the first aspect of the present invention, the first binary signal comprises a clock signal. In a further possible embodiment of the method according to the first aspect of the present invention, the second binary signal comprises a data signal.

In a still further possible embodiment of the method according to the first aspect of the present invention, estimating the phase relation between the first binary signal and the second binary signal comprises the substep of calculating the absolute value of the difference between the first edge time and the third edge time to provide a numerator value.

In a still further possible embodiment of the method according to the first aspect of the present invention, estimating the phase relation between the first binary signal and the second binary signal comprises the substep of calculating a difference between the second edge time and the first edge time and to multiply the calculated difference with a predetermined factor to provide a denominator value.

In a further possible embodiment of the method according to the first aspect of the present invention, estimating the phase detection between the first binary signal and the second binary signal comprises the substep of calculating a quotient between a numerator value and a denominator value to provide the estimated phase relation between both binary signals.

In a further possible embodiment of the method according to the first aspect of the present invention, estimating the phase relation between the first binary signal and the second binary signal comprises determining whether a calculated quotient comprises an even value.

In a still further possible embodiment of the method according to the first aspect of the present invention, the calculation substeps during estimation of the phase relation between the first binary signal and the second binary signal are repeated for a predetermined repetition number to generate a set of calculated quotients comprising at least two calculated quotients.

In a still further possible embodiment of the method according to the first aspect of the present invention, if a predetermined number of consecutive quotients having an even value is determined within the generated set of quotients, the binary signals are classified as being in-phase.

In a further possible embodiment of the method according to the first aspect of the present invention, if a predetermined number of consecutive quotients having an uneven number value is determined within the generated set of quotients, the binary signals are classified as being out-of-phase.

In a further possible embodiment of the method according to the first aspect of the present invention, determining whether the calculated quotient comprises an even value is performed by a modulo 2 operation.

In a still further possible embodiment of the method according to the first aspect of the present invention, the estimated phase difference between the first binary signal and the second binary signal is used to differentiate between a read frame and a write frame in decode results of a DDR protocol decoder of a measurement device.

In a still further possible embodiment of the method according to the first aspect of the present invention edge times of first and secondary binary signals having an overlap in time below a predetermined minimum overlap time are discarded.

The invention further provides according to a second aspect an apparatus for estimation of a phase relation between a first binary signal and a second binary signal, wherein both binary signals comprise over the course of time rising and falling signal edges at edge times, the apparatus comprising a determination unit adapted to determine a first edge time and a subsequent second edge time of the first binary signal and to determine a third edge time of the second binary signal, and a phase estimation unit adapted to estimate the phase relation between the first binary signal and the second binary signal based upon the first, second and third edge times.

In a possible embodiment of the apparatus according to the second aspect of the present invention, the phase estimation unit is adapted to calculate the absolute value of the difference between the first edge time and the third edge time to provide a numerator value, to calculate a difference between the second edge time and the first edge time and multiplying the calculated difference with a predetermined factor to provide a denominator value, to calculate a quotient between the numerator value and the denominator value to provide the estimated phase relation between both binary signals and to determine whether the calculated quotient comprises an even value or not.

In a possible embodiment of the apparatus according to the second aspect of the present invention, the phase estimation unit is adapted to repeat the calculation substeps for a predetermined repetition number to generate a set of calculated quotients comprising at least two calculated quotients.

In a further possible embodiment of the apparatus according to the second aspect of the present invention, if the number of consecutive quotients with an even value within the generated set does reach a predetermined threshold, the binary signals are classified as being in-phase and if the number of consecutive quotients with an uneven value within the generated set reaches a predetermined threshold, the binary signals are classified as being out-of-phase.

The invention further provides according to a third aspect a measurement device comprising an apparatus for estimation of a phase relation between a first binary signal and a second binary signal wherein both binary signals comprise over the course of time rising and falling signal edges at edge times, wherein the estimation apparatus comprises a determination unit adapted to determine a first edge time and a subsequent second edge time of the first binary signal and to determine a third edge time of the second binary signal, a phase estimation unit adapted to estimate the phase relation between the first binary signal and the second binary signal based upon the first, second and third edge times, said measurement device further comprising a double data rate, DDR, protocol decoder, wherein the phase difference between the first binary signal and the second binary signal estimated by said estimation apparatus is used to differentiate between a read frame and a write frame in decode results of the double data rate, DDR, protocol decoder of said measurement device.

BRIEF DESCRIPTION OF FIGURES

In the following, possible embodiments of the different aspects of the present invention are described in more detail with reference to the enclosed figures.

DETAILED DESCRIPTION

Figure 1:
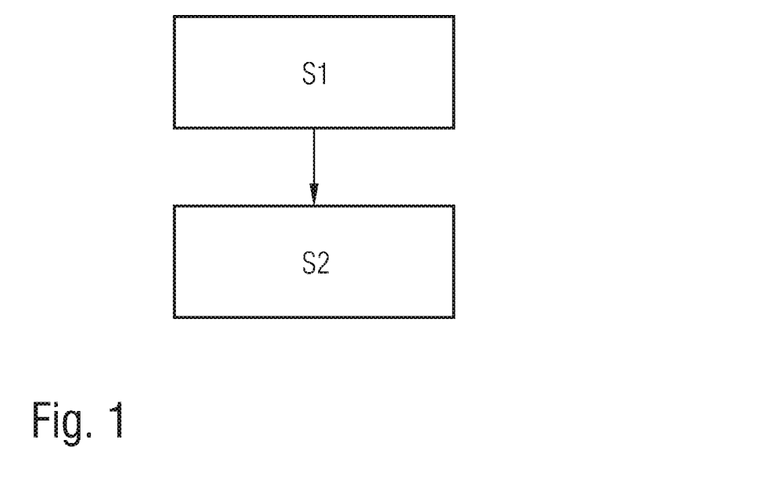
FIG. 1 shows a flowchart of a possible exemplary embodiment of a method for estimating a phase relation between binary signals according to a first aspect of the present invention.
Figure 4:
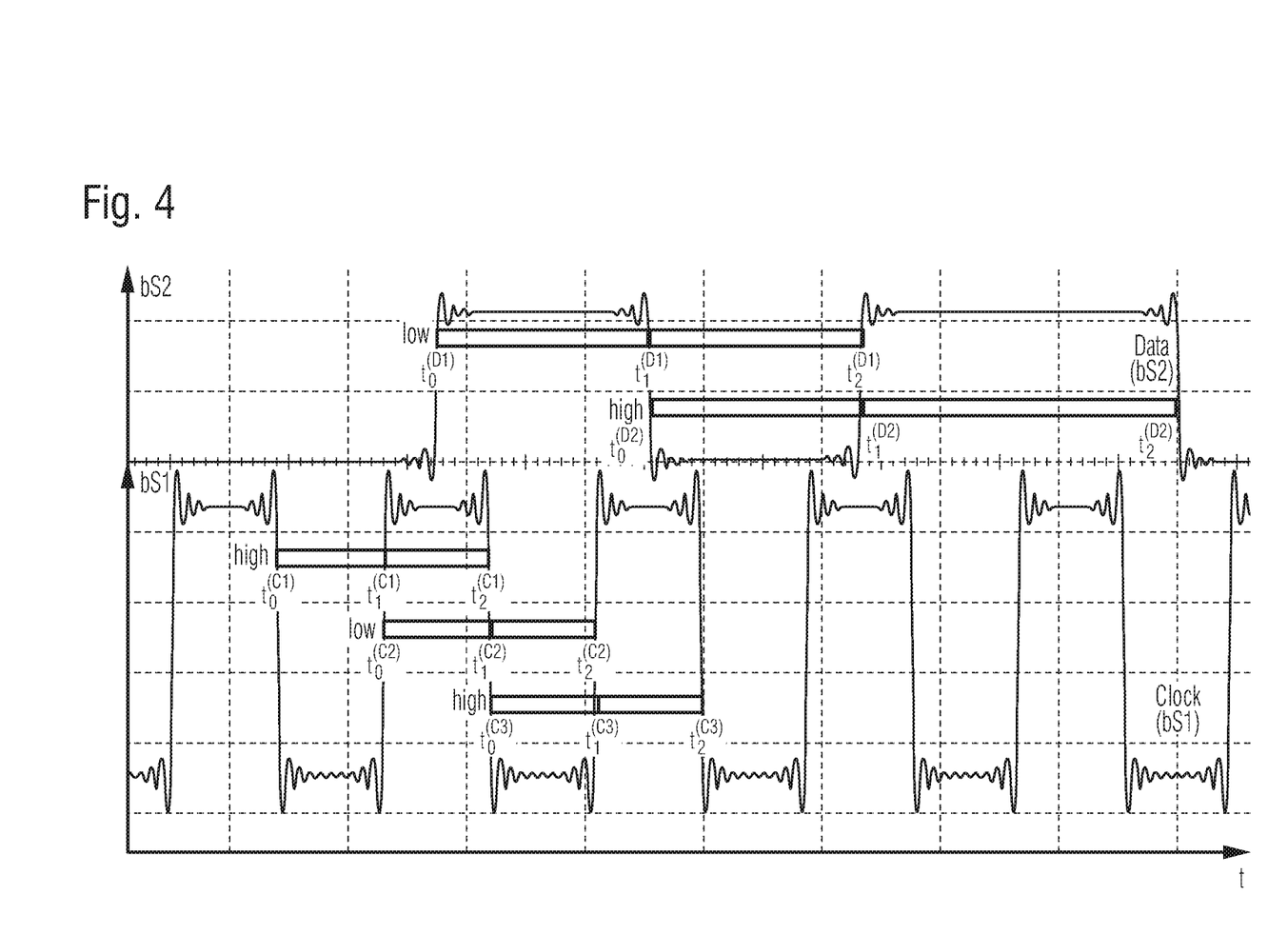
FIG. 4 shows a signal diagram for illustrating the operation of a method and apparatus according to the present invention.
Figure 5:
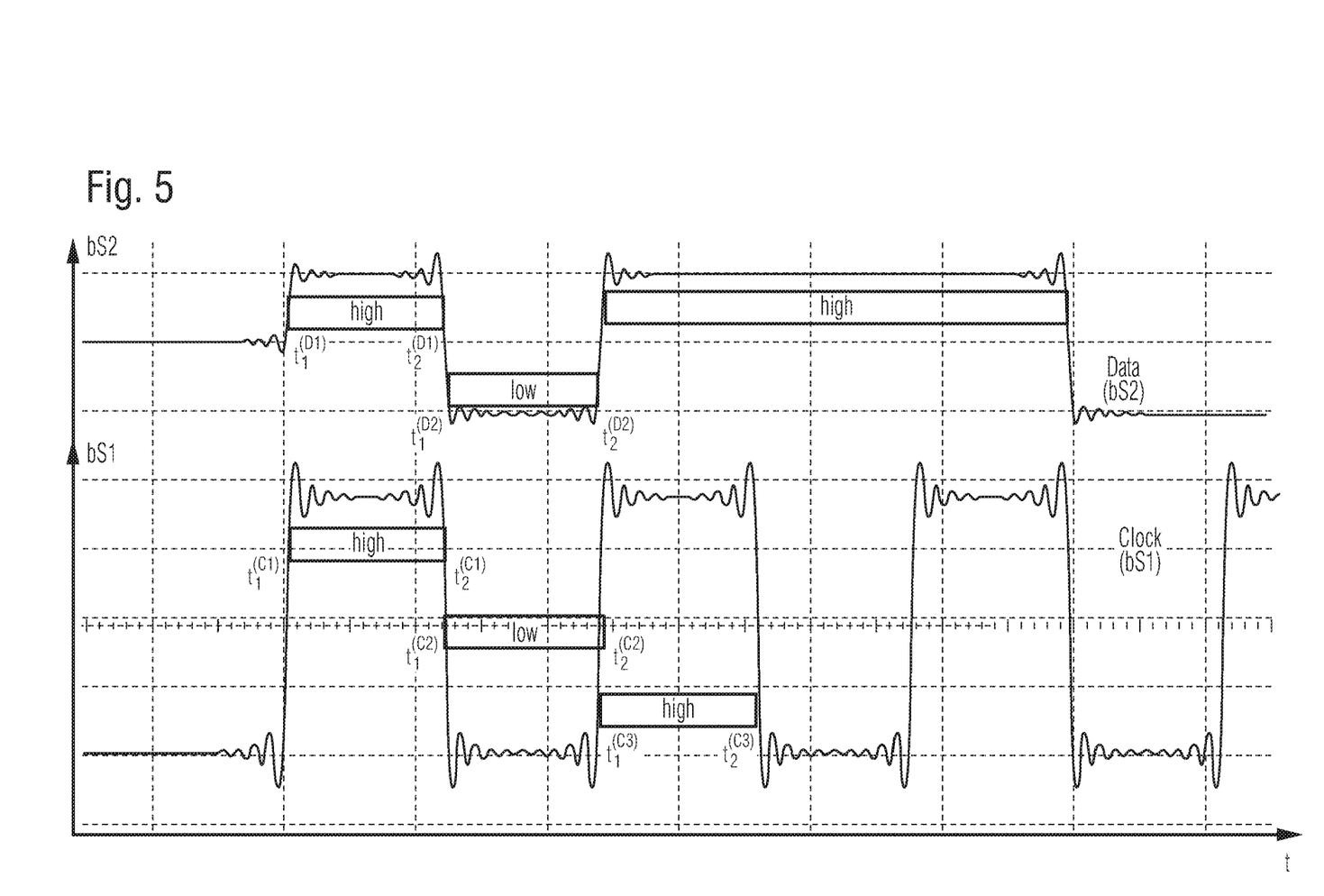
FIG. 5 shows a further signal diagram for illustrating the operation of a method and apparatus according to the present invention.
Figure 6:
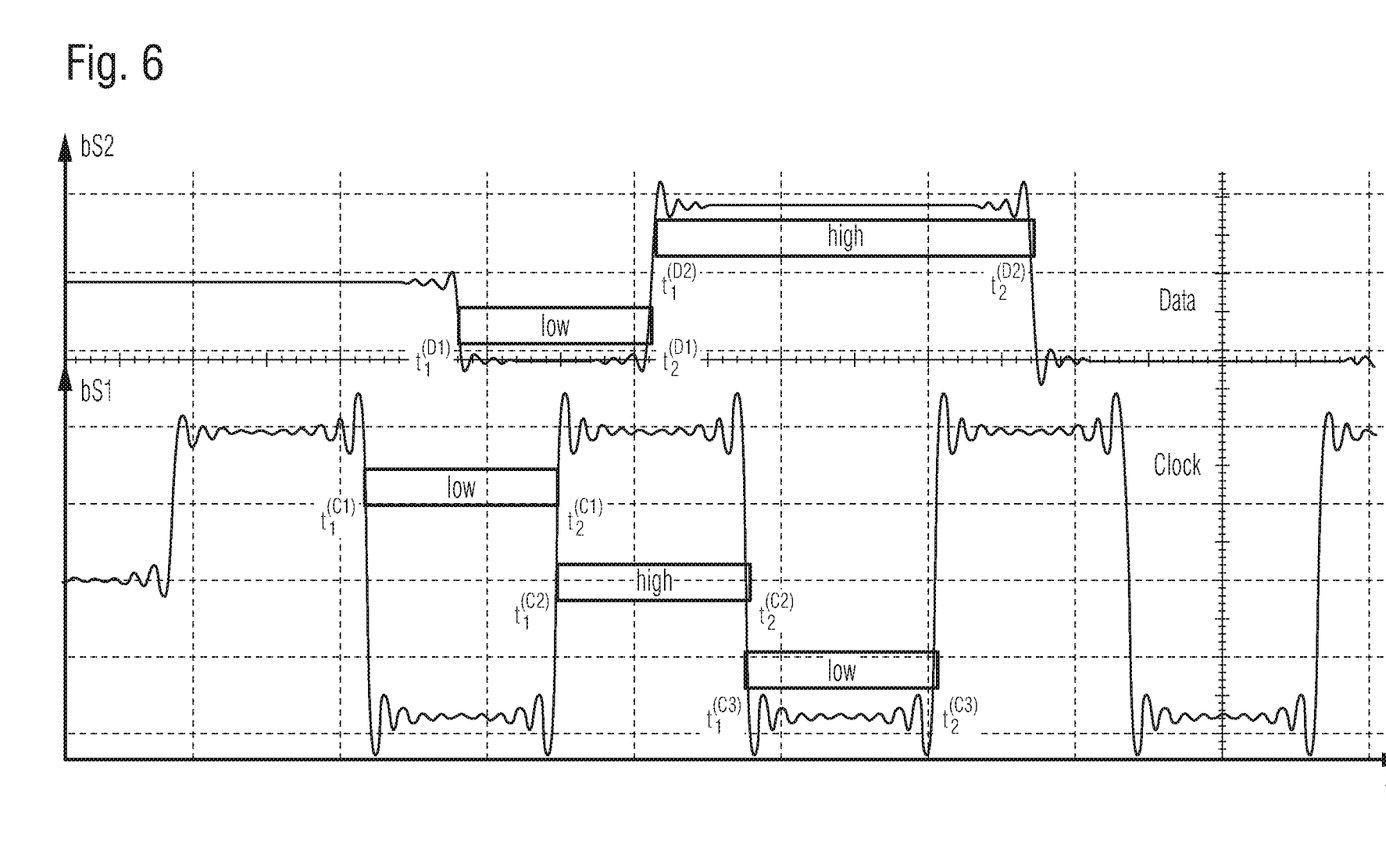
FIG. 6 shows a further signal diagram for illustrating the operation of a method and apparatus according to the present invention.

As can be seen in the flowchart of FIG. 1, a method for estimating a phase relation between two binary signals can comprise in a possible embodiment two main steps S1, S2. The method illustrated in FIG. 1 can be used to estimate a phase relation between a first binary signal bs1 and a second binary signal bs2. In a possible embodiment, the first binary signal bs1 can comprise a clock signal as also illustrated in the signal diagrams of FIGS. 4, 5, 6. The second binary signal bs2 can comprise in a possible exemplary embodiment a data signal as also illustrated in FIGS. 4, 5, 6. The binary signals can also be formed by other kinds of digital signals. For example, the two binary signals can comprise two digital signals or two clock signals. Both binary signals comprise over the course of time rising and falling signal edges at edge times. At the signal edges, the binary signal changes its signal level.

In a first step S1, a first edge time $t1^{(bs1)}$ and a subsequent second edge time $t2^{(bs1)}$ of the first binary signal bs1 is determined. The first binary signal can for instance comprise a clock signal. Further, in step S1, a third edge time $t1^{(bs2)}$ of a second binary signal bs2 is determined. The second binary signal can comprise in a possible embodiment a data signal.

In a further step S2, the phase relation between the first binary signal bs1 and the second binary signal bs2 is estimated based upon the first, second and third edge times.

In a possible embodiment, the first binary signal bs1 comprises a clock signal CLK and the second binary signal bs2 comprises a data signal. Accordingly, the method illustrated in FIG. 1 is used in this use case for estimating a phase relation between the clock signal and the data signal. A data signal can comprise a sequence of bits each comprising a high and a low logical value. An edge time comprises at time where one of the binary signals crosses a predetermined threshold, i.e. where a signal transition takes place. Given two sets of signal edges, i.e. one set from the first binary signal bs1 and one set from the second binary signal bs2, the method as illustrated in the flowchart of FIG. 1 can determine or decide if both binary signals bs1, bs2 are either in-phase or out-of-phase. The binary signals bs are considered to be in-phase if the binary signals bs do swing together whereas they are considered to be out-of-phase if transitions in the second binary signal bs2 happen about halfway between transitions of the first binary signal bs1. The method illustrated in the flowchart of FIG. 1 can filter in a possible embodiment out edge events of the first and second binary signal having little or no overlap in time. For the remaining events, i.e. the not discarded edge times, the method accumulates in a possible implementation heuristic decisions on the phase difference between signal edge events of the two binary signals.

If the first binary signal bs1 comprises a clock signal CLK and the second binary signal bs2 comprises a data signal, the decision rule can be as follows:

If the difference between a first edge time of a clock signal CLK and the third edge time of the second binary signal (data signal) is an even multiple of a clock signal half-period, the events are in-phase, otherwise they are out-of-phase.

In a possible implementation, if there are enough decisions to reach a 95% confidence interval, a final call can be made on whether the clock and data signals are in-phase or out-of-phase. Accordingly, the decision whether two binary signals are in-phase or out-of-phase is derived from a triplet of timestamps or edge times at signal transitions of the two binary signals.

Figure 2:
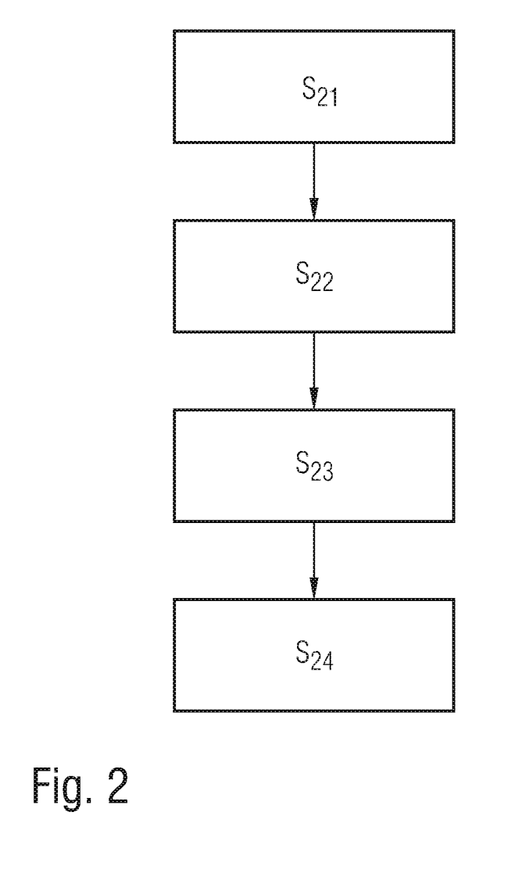
FIG. 2 shows a further flowchart for illustrating substeps for estimating a phase relation between two binary signals forming part of the method illustrated in the flowchart of FIG. 1.

FIG. 2 shows a flowchart of substeps performed for estimating a phase relation between two binary signals based upon the remaining not discarded first, second and third edge times in step S2 of the method illustrated in FIG. 1.

In a first substep S21, an absolute value of the difference between the first edge time $t1^{(bs1)}$ and the third edge time $t1^{(bs2)}$ is calculated to provide a numerator value.

In a further substep S22, the difference between the second edge time $t2^{(bs1)}$ and the first edge time $t1^{(bs1)}$ is calculated and multiplied with a predetermined factor to provide a denominator value. The factor is configurable and comprises in a preferred embodiment a value of 0.5.

In a further substep S23, a quotient φ between the numerator value and the denominator value is calculated to provide an estimated phase relation between both binary signals.

Finally, in substep S24, it can be determined whether the calculated quotient comprises an even value or not.

The determination whether the calculated quotient φ comprises an even value or not can be performed in a possible embodiment by a modulo 2 operation.

In a possible embodiment, the calculation substeps as illustrated in FIG. 2 for an estimation of the phase relation between the two binary signals can be repeated for a predetermined repetition number R to generate a set of calculated quotients φ. The generated set of calculated quotients comprises at least two calculated quotients.

If a predetermined number N of consecutive quotients having an even value is determined within the generated set of quotients, binary signals bs1, bs2 are classified as being in-phase. In contrast, if a predetermined number of consecutive quotients having an uneven number value is determined within the generated set of quotients, the binary signals bs1, bs2 are classified as being out-of-phase. The predetermined number N required to determine whether the two binary signals bs1, bs2 are classified as being either in-phase or out-of-phase is configurable in a preferred embodiment. In a possible embodiment, the estimated phase difference between the first binary signal bs1 (e.g. clock signals) and the second binary signal bs2 (e.g. data signal) is used to differentiate between a read frame and a write frame in decode results of a double-data-rate, DDR, protocol decoder of a measurement device. The double-data-rate protocol decoder can comprise a double-data-rate 3 protocol decoder which may be used in a oscilloscope application suite. In this use case, the method as illustrated in the flow charts of FIGS. 1, 2 is adapted to detect phase differences between a first binary signal bs1, i.e. clock signal or strobe, and one or more binary signals bs2, i.e. data signals, which is necessary to differentiate between read and write frames in the decoding results of the DDR protocol decoder.

In a possible embodiment, the phase relations φ between the two binary signals bs1, bs2 are calculated as follows:

$$\varphi = \frac{|t_1^{(bs1)} - t_1^{(bs2)}|}{0.5(t_2^{(bs1)} - t_1^{(bs1)})} \quad (1)$$

Depending on the calculated quotient, it can be decided whether the signal is in-phase or out-of-phase as follows:

$$\text{Phase} = \begin{cases} \text{in-phase} & \text{if } \varphi \bmod 2 = 0 \\ \text{out-of-phase} & \text{if } \varphi \bmod 2 \neq 0 \end{cases} \quad (2)$$

Figure 3:
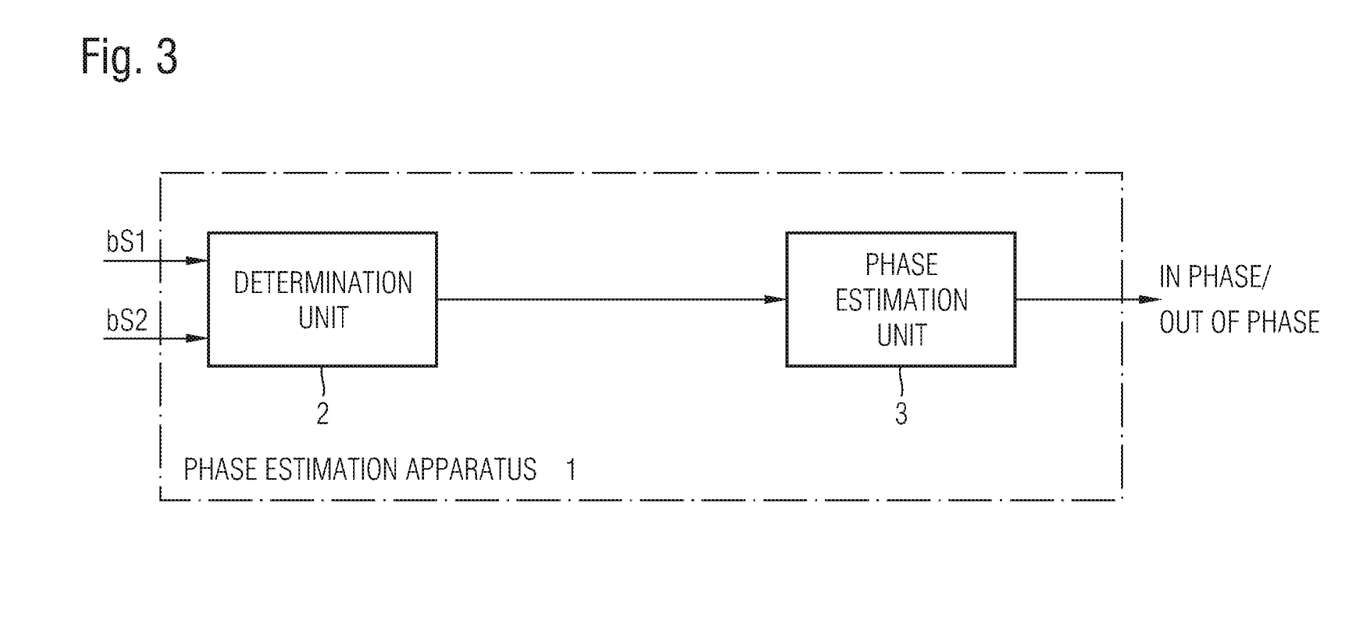
FIG. 3 shows a block diagram of a possible exemplary embodiment of a phase estimation apparatus according to a further aspect of the present invention.

FIG. 3 shows a block diagram of a possible exemplary embodiment of a phase estimation apparatus 1 according to an aspect of the present invention. In the illustrated embodiment, the phase estimation apparatus 1 is used to estimate a phase relation between a first binary signal bs1 and a second binary signal bs2 applied to the phase estimation apparatus 1 as shown in FIG. 3. In the illustrated exemplary embodiment, the phase estimation apparatus 1 comprises two main units as shown in FIG. 3. The phase estimation apparatus 1 comprises in the illustrated embodiment a determination unit 2 and a phase estimation unit 3.

The determination unit 2 is adapted to determine a first edge time $t1^{(bs1)}$ and a subsequent second edge time $t2^{(bs1)}$ of the first binary signal bs1 and to determine a third edge time $t1^{(bs2)}$ of a second binary signal bs2. The first binary signal bs1 can comprise for instance a clock signal CLK received via a clock signal line. The second binary signal bs2 can comprise in a possible embodiment a data signal received via a separate data signal line. In a further possible embodiment, more than one data signal can be applied as additional second binary signals to the input of the phase estimation apparatus 1. The determination unit 2 determines a first edge time, (first signal transition time) and a subsequent second edge time (second signal transition time) of the first binary signal bs1, e.g. the clock signal CLK. The determination unit 2 further determines a third edge time (third signal transition time) of the second binary signal bs2, i.e. the data signal. Accordingly, the determination unit 2 generates in a possible embodiment a triplet of edge times or timestamps applied to the following phase estimation unit 3.

A discarding unit (not shown) can be provided in a possible embodiment adapted to discard edge times (timestamps) of the first and second binary signals having an overlap in time below a predetermined minimum overlap time. In a possible embodiment, the minimum overlap time is configurable. The not discarded edge times are supplied to the following phase estimation unit 3 of the phase estimation apparatus 1.

In a possible embodiment, the phase estimation unit 3 is adapted to perform the calculation substeps as illustrated in the flowchart of FIG. 2. The phase estimation unit 3 is adapted in a possible embodiment to calculate the absolute value of the difference between the first edge time $t1^{(bs1)}$ and the third edge time $t1^{(bs2)}$ to provide a numerator value, to calculate then a difference between the second edge time $t2^{(bs1)}$ and the first edge time $t1^{(bs1)}$ and multiplying the calculated difference with a predetermined factor such as a factor of 0.5 to provide a denominator value. The phase estimation unit 3 is further adapted to calculate a quotient φ between the numerator value and the denominator value to provide the estimated phase relation φ between both binary signals bs1, bs2. Depending on the calculated phase relation, it can be determined whether the calculated quotient comprises an even value or not. The determination whether the calculated quotient comprises an even value or not can be performed in a possible implementation by a modulo 2 operation, i.e.

if φ mod2=0, the calculated quotient comprises an even value, whereas if φ mod2≠0, the calculated quotient comprises a not even value.

The phase estimation unit 3 is adapted to repeat the calculation substeps as illustrated in FIG. 2 in a possible embodiment for a predetermined repetition number R to generate a set of calculated quotients comprising at least two calculated quotients. If the number of consecutive quotients with an even value within the generated set of quotients does reach a predetermined threshold, the binary signals bs1, bs2 are classified as being in-phase by a classifier of the phase estimation unit 3. In contrast, if the number of consecutive quotients with an uneven value within the generated set reaches a predetermined threshold, the binary signals bs1, bs2 are classified as being out-of-phase by a classifier of the phase estimation unit 3. In a possible embodiment, the generated set of calculated quotients is temporarily stored in a memory for being processed by the classifier of the phase estimation unit 3. In a possible embodiment, the repetition number R as the number of calculated quotients within a generated set is configurable. Further, the threshold values to be reached by a number of consecutive quotients having an even or having an uneven value can also be configurable depending on the use case. In a possible implementation, the phase estimation apparatus 1 is used to determine a phase relation ϕ between a clock signal CLK as a first binary signal bs1 and a data signal as a second binary signal bs2, in particular a double-data-rate data signal. A double-data-rate signal can comprise for instance a DDR3 data signal. The double-data-rate signal transfers data on both the rising and falling edges of the clock signal CLK.

FIG. 4 illustrates a signal diagram of a first binary signal bs1 formed by a clock signal CLK and a second binary signal bs2 formed by a data signal to illustrate the operation of the method and apparatus 1 according to the present invention. The method according to the present invention can process a set of signal edges, i.e. one set from the first binary signal bs1 (clock signal) and one set from the second binary signal bs2 (data signal). The method can be implemented as an algorithm executed on a processor to decide whether the two binary signals bs1, bs2 are in-phase or out-of-phase. In the illustrated example of FIG. 4, the binary signals bs are considered to be in-phase if they both swing together. In the illustrated example, the clock signal CLK and the data signal are considered to be out-of-phase if the data transitions of the data signal happen halfway between the signal transitions of the clock signal CLK. In a possible embodiment, edge events are built from the detected signal crossings which can be defined as a triplet of timestamps t0, t1, t2 as illustrated in FIG. 4 and an orientation (high or low). The method can filter out data and clock edge events with little or no overlap in time. For the remaining events, the method accumulates heuristic decisions on the phase difference between clock and data edge events.

FIG. 5 illustrates a case where the two binary signals bs1, bs2 are determined to be in-phase. In the illustrated example of FIG. 5, the first edge time $t1^{(bs1)}=1$, the second edge time $t2^{(bs1)}=2$ and the third edge time $t1^{(bs2)}=1$. Therefore: Applying the formula (1) given above leads to a calculated quotient $$\varphi = \frac{|1-1|}{0.5(2-1)} \cdot = \frac{0}{0.5} = 0$$

Further, applying the modulo 2 operation given by formula (2) ϕ mod2=0 mod2=0. Since the modulo 2 operation provides a value of 0, the two binary signals bs1, bs2 are classified as being in-phase.

FIG. 6 shows a further example illustrating a scenario where the two binary signals bs1, bs2 are classified to be out-of-phase. In the given example, the first edge time $t1^{(bs1)}=2$, the second edge time $t2^{(bs1)}=3$ and the third edge time $t1^{(bs2)}=2.5$. So: Applying formula (1) provides quotient ϕ as follows:

$$= \frac{|2-2.5|}{0.5(3-2)} \cdot = \frac{0.5}{0.5} = 1$$

Performing the modulo 2 operation provides a value as follows: ϕ mod2=1 mod2=1≠0 Accordingly, the two binary signals bs1, bs2 are classified as being out-of-phase.

Figure 7:
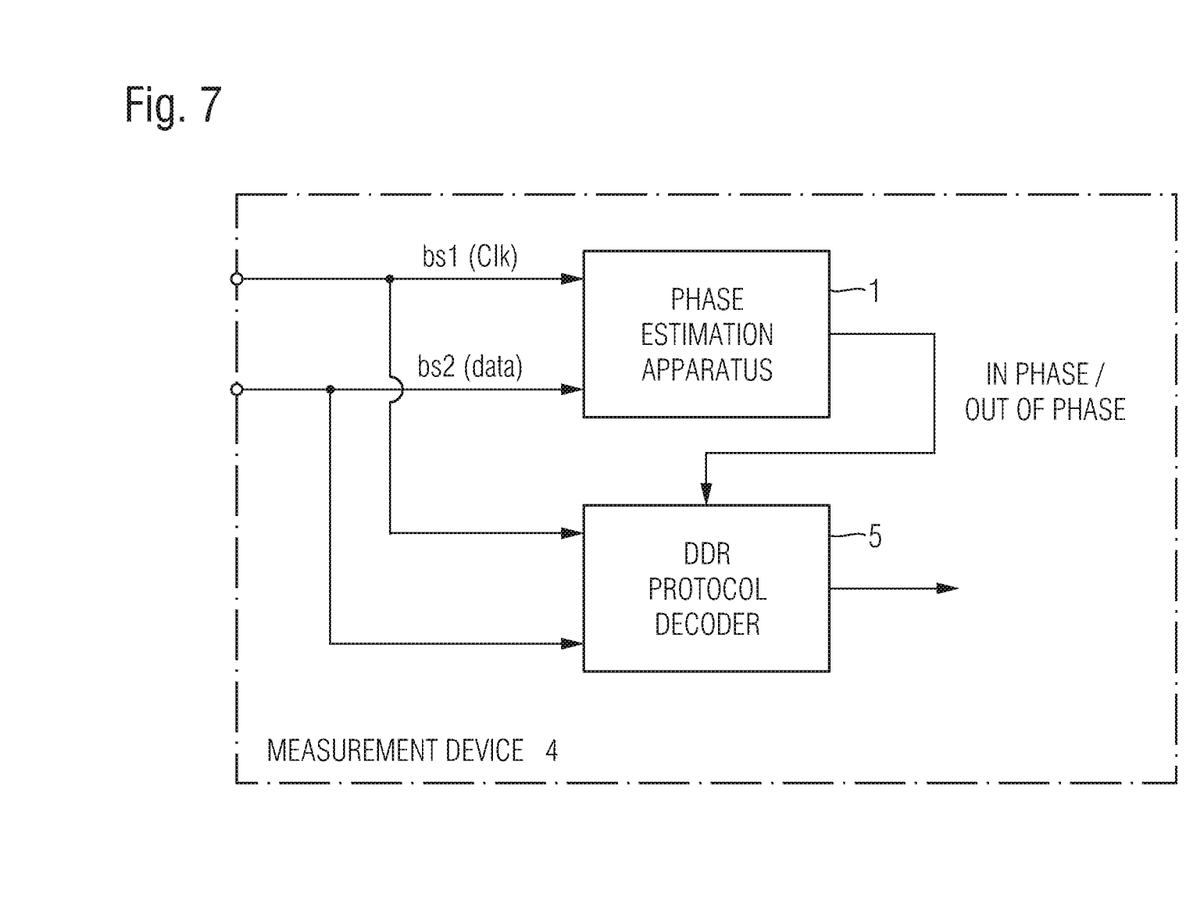
FIG. 7 shows a block diagram for illustrating a possible exemplary embodiment of a measurement device according to a further aspect of the present invention.

FIG. 7 shows a block diagram of a possible exemplary embodiment of a measurement device 4 including a phase estimation apparatus 1 as illustrated in the block diagram of FIG. 3 and a double-data-rate protocol decoder 65 In the illustrated embodiment of FIG. 7, the measurement device 4 is used for estimation of a phase relation ϕ between a first binary signal bs1 (such as a clock signal) and a second binary signal bs2 (such as a data signal). Both binary signals bs1, bs2 are applied to signal inputs of the measurement device 4 as illustrated in FIG. 7. Both binary signals bs1, bs2 comprise over the course of time rising and falling signal edges at different edge times. The phase estimation apparatus 1 comprises the main units as illustrated in the block diagram of FIG. 3, i.e. a determination unit 2 and a phase estimation unit 3. In the illustrated embodiment, the measurement device 4 comprises further a double-data-rate, DDR, protocol decoder 5, in particular a double-data-rate DDR 3 protocol decoder. The double-data-rate DDR protocol decoder 5 of the measurement device 4 also receives the binary signals bs1, bs2 and further receives from the phase estimation apparatus 1 information whether the two binary signals bs1, bs2 are in-phase or out-of-phase. The phase difference between the first binary signal bs1 and a second binary signal bs2 as estimated by the phase estimation apparatus 1 is used to differentiate between read and write frames in the decode results. In a possible embodiment, the measurement device 4 can comprise an oscilloscope having a double-data-rate protocol decoder 5 receiving information about the phase relation from an integrated phase estimation apparatus 1 as illustrated in the block diagram of FIG. 7. In a possible embodiment, the phase estimation apparatus 1 can also be integrated into the double-data-rate protocol decoder 5. The configuration parameters of the phase estimation apparatus 1 can be loaded into a configuration register in a possible embodiment. The configurable parameters can comprise a required number of consecutive quotients to classify the binary signals and the repetition number R. Further, the calculation formula can be configured, in particular the factor to provide the denominator value.

The phase estimation apparatus 1 allows to classify the binary signals bs1, bs2 as in-phase or out-of-phase very fast and can be implemented without requiring high complexity. Phase estimation can be performed even at very high signal rates in a robust and reliable manner even for noisy signals. The binary signals bs1, bs2 can comprise a very high frequency exceeding e.g. 100 MHz. The applied data signals can comprise double-data-rate DDR signals. The method and apparatus 1 according to the present invention can be used for any kinds of binary signals, e.g. also for a phase detection between two data signals and for a phase detection between two clock signals. In a possible embodiment, the steps of method illustrated in FIG. 1 can comprise a computer-implemented method steps executed by a processing unit or microprocessor. Further, because of the relative simple calculation operations, the method can also be implemented in a hardware module.

In a possible embodiment the output signal of the phase estimation apparatus 1 comprises also a binary signal bs carrying a sequence of bits indicating the detected phase information by to different logical values and corresponding signal levels, e.g. a high signal level for "in phase" and a low signal level value for "out of phase". This binary output signal can be applied as a binary signal to another phase estimation apparatus 1' to be compared with another binary signal. Accordingly it is possible to connect several phase estimation apparatuses 1 as shown in the block diagram of FIG. 3 in a cascade structure.

The invention claimed is:

1. A method for estimating a phase relation between a first binary signal, bs1, and a second binary signal, bs2, wherein both binary signals comprise over the course of time rising and falling signal edges at edge times, the method comprising the steps of:
receiving, by a determination unit, the first binary signal via a first signal line;
receiving, by the determination unit, the second binary signal via a second signal line;
determining, by the determination unit, a first edge time, t1(bs1), and a subsequent second edge time, t2(bs1), of the first binary signal, bs1, and determining a third edge time, t1(bs2) of the second binary signal, bs2;
generating, by the determination unit, a triplet of edge times and providing the generated triplet to a phase estimation unit;
estimating, by the phase estimation unit, the phase relation between the first binary signal, bs1, and the second binary signal, bs2, based upon the first, second and third edge times; and
outputting, by the phase estimation unit, a binary signal carrying a sequence of bits indicating the detected phase relation between the first binary signal and the second binary signal to improve data transfers within a computer and its memory.

2. The method according to claim 1 wherein the first binary signal, $bs_1$, comprises a clock signal received via a clock signal line.

3. The method according to claim 1 wherein the second binary signal, $bs_2$, comprises a data signal received via a data signal line.

4. The method according to claim 1 wherein estimating the phase relation between the first binary signal, $bs_1$, and the second binary signal, $bs_2$, comprises a substep of:
calculating the absolute value of the difference between the first edge time, $t_1^{(bs1)}$, and the third edge time, $t_1^{(bs2)}$, to provide a numerator value.

5. The method according to claim 4 wherein estimating the phase relation between the first binary signal, $bs_1$, and the second binary signal, $bs_2$, comprises a substep of:
calculating a difference between the second edge time, $t_2^{(bs1)}$ and the first edge time, $t_1^{(bs1)}$, and to multiply the calculated difference with a predetermined factor to provide a denominator value.

6. The method according to claim 5 wherein estimating the phase detection between the first binary signal, $bs_1$, and the second binary signal, $bs_2$, comprises substep of:
calculating a quotient, $\phi$, between a numerator value and a denominator value to provide the estimated phase relation between both binary signals.

7. The method according to claim 6 wherein estimating the phase relation between the first binary signal, $bs_1$, and the second binary signal, $bs_2$, comprises determining whether a calculated quotient, $\phi$, comprises an even value.

8. The method according to claim 7 wherein the calculation steps during estimation of the phase relation between the first binary signal, $bs_1$, and the second binary signal, $bs_2$, are repeated for a predetermined repetition number, R, to generate a set of calculated quotients, $\phi$, comprising at least two calculated quotients.

9. The method according to claim 8 wherein if a predetermined number N of consecutive quotients having an even value is determined within the generated set of quotients, the binary signals are classified as being in-phase, and
wherein if a predetermined number N of consecutive quotients having an uneven number value is determined within the generated set of quotients, the binary signals are classified as being out-of-phase.

10. The method according to claim 7 wherein determining whether the calculated quotient, $\phi$, comprises an even value is performed by a modulo 2 operation.

11. The method according to claim 1 wherein the estimated phase difference between the first binary signal, $bs_1$, and the second binary signal, $bs_2$, is used to differentiate between a read frame and a write frame in decode results of a double data rate protocol decoder of a measurement device.

12. The method according to claim 1, wherein edge times of the first and secondary binary signals having an overlap in time below a predetermined minimum overlap time are discarded.

13. An apparatus for estimation of a phase relation between a first binary signal, bs1, and a second binary signal, bs2,
wherein both binary signals comprise over the course of time rising and falling signal edges at edge times, the apparatus comprising one or more processing units implemented in circuitry, the one or more processing units comprising a determination unit and a phase estimation unit, wherein
the determination unit is connected to a first signal line and a second signal line, and the determination unit is configured to receive the first binary signal via the first signal line,
to receive the second binary signal via the second signal line, to determine a first edge time, t1(bs1), and a subsequent second edge time, t2(bs1), of the first binary signal, bs1, to determine a third edge time, t1(bs2), of the second binary signal, bs2, to generate a triplet of edge times, and to provide the generated triplet to the phase estimation unit; and
the phase estimation unit is configured to estimate the phase relation between the first binary signal, bs1, and the second binary signal, bs2, based upon remaining not discarded first, second and third edge times, and to output a binary signal carrying a sequence of bits indicating the detected phase relation between the first binary signal and the second binary signal to improve data transfers within a computer and its memory.

14. The apparatus according to claim 13 wherein the phase estimation unit is configured to calculate the absolute value of the difference between the first edge time, $t_1^{(bs1)}$, and the third edge time, $t_1^{(bs2)}$, to provide a numerator value, to calculate a difference between the second edge time, $t_2^{(bs1)}$, and the first edge time, $t_1^{(bs1)}$, and multiplying the calculated difference with a predetermined factor to provide a denominator value, to calculate a quotient, $\phi$, between the numerator value and the denominator value to provide the estimated phase relation between both binary signals and to determine whether the calculated quotient comprises an even value or not.

15. The apparatus according to claim 14 wherein the phase estimation unit is configured to repeat the calculation substeps for a predetermined repetition number, R, to generate a set of calculated quotients comprising at least two calculated quotients.

16. The apparatus according to claim 14 wherein if the number N of consecutive quotients with an even value within the generated set does reach a predetermined threshold, the binary signals are classified as being in-phase and wherein if the number N of consecutive quotients with an uneven value within the generated set reaches a predetermined threshold, the binary signals are classified as being out-of-phase.

17. A measurement device comprising an apparatus for estimation of a phase relation between a first binary signal, $bs_1$, and a second binary signal, $bs_2$, wherein both binary signals comprise over the course of time rising and falling signal edges at edge times, the estimation apparatus comprising one or more processing units implemented in circuitry, the one or more processing units comprising a determination unit and a phase estimation unit, wherein the determination unit is connected to a first signal line and a second signal line, and the determination unit is configured to receive the first binary signal via the first signal line, to receive the second binary signal via the second signal line to determine a first edge time, $t_1^{(bs1)}$, and a subsequent second edge time, $t_2^{(bs1)}$, of the first binary signal, $bs_1$, to determine a third edge time, $t_1^{(bs2)}$, of the second binary signal, $bs_2$, to generate a triplet of edge times, and to provide the generated triplet to the phase estimation unit;

the phase estimation unit is configured to estimate the phase relation between the first binary signal, $bs_1$, and the second binary signal, $bs_2$, based upon the first, second and third edge times, and to output a binary signal carrying a sequence of bits indicating the detected phase relation between the first binary signal and the second binary signal;

said measurement device further comprising a double data rate, DDR, protocol decoder, wherein the binary signal output by the phase estimation unit of said estimation apparatus is used to differentiate between a read frame and a write frame in decode results of the double data rate, DDR, protocol decoder of said measurement device.

* * * * *